(12) United States Patent
Huang

(10) Patent No.: US 10,825,411 B2
(45) Date of Patent: Nov. 3, 2020

(54) SHUTDOWN SIGNAL GENERATION CIRCUIT AND DISPLAY APPARATUS

(71) Applicants: HKC Corporation Limited, Shenzhen (CN); Chongqing HKC Optoelectronics Technology Co., Ltd., Chongqing (CN)

(72) Inventor: Xiaoyu Huang, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 16/461,976

(22) PCT Filed: Mar. 30, 2018

(86) PCT No.: PCT/CN2018/081246
§ 371 (c)(1),
(2) Date: May 17, 2019

(87) PCT Pub. No.: WO2019/127961
PCT Pub. Date: Jul. 4, 2019

(65) Prior Publication Data
US 2020/0251064 A1 Aug. 6, 2020

(30) Foreign Application Priority Data
Dec. 26, 2017 (CN) .......................... 2017 1 1434443

(51) Int. Cl.
*G09G 3/36* (2006.01)
*G09G 3/30* (2006.01)
*H03K 17/00* (2006.01)

(52) U.S. Cl.
CPC ......... *G09G 3/3648* (2013.01); *H03K 17/002* (2013.01); *G09G 2310/0243* (2013.01)

(58) Field of Classification Search
CPC . G09G 2330/027; G09G 3/3674–3681; G09G 2310/067
See application file for complete search history.

(56) References Cited

U.S. PATENT DOCUMENTS

2011/0102416 A1* 5/2011 Hung .................. G09G 3/3677
345/213
2012/0280965 A1 11/2012 Lee
(Continued)

FOREIGN PATENT DOCUMENTS

CN 105427818 A 3/2016

*Primary Examiner* — Sanghyuk Park
(74) *Attorney, Agent, or Firm* — Muncy, Geissler, Olds & Lowe, P.C.

(57) ABSTRACT

This application provides a shutdown signal generation circuit and a display apparatus. The shutdown signal generation circuit includes: a first switch, where a first end of the first switch is electrically coupled to a first frequency, a control end of the first switch is electrically coupled to a first node, and a second end of the first switch is electrically coupled to a second node; and a second switch, wherein a first end of the second switch is electrically coupled to a second frequency, a control end of the second switch is electrically coupled to the first node, and a second end of the second switch is electrically coupled to the second node, where the first node is electrically coupled to a control signal, and the second node electrically outputs a gate shutdown signal.

20 Claims, 8 Drawing Sheets

(56) References Cited

U.S. PATENT DOCUMENTS

2015/0348487 A1* 12/2015 Zheng .................. G09G 3/3611
                                                      345/213
2017/0345372 A1* 11/2017 Xiao .................... G09G 3/3266

* cited by examiner

SHUTDOWN SIGNAL GENERATION CIRCUIT AND DISPLAY APPARATUS

TECHNICAL FIELD

This application relates to the field of control signal generation circuit technologies, and in particular, to a shutdown signal generation circuit providing a shutdown signal to a gate drive circuit on a substrate, and a display apparatus.

BACKGROUND

A liquid crystal display device usually includes a gate drive circuit, a source drive circuit, and a pixel array. The pixel array has a plurality of pixel circuits, and each pixel circuit is turned on and turned off according to a scanning signal provided by the gate drive circuit, and displays a data image according to a data signal provided by the source drive circuit. The gate drive circuit usually has a plurality of stages of shift registers. Scanning signals are output to the pixel array after being transferred through the shift registers stage by stage, to sequentially turn on the pixel circuits. In this way, the pixel circuits receive data signals.

Therefore, in a drive circuit process, a gate drive circuit is directly manufactured on an array substrate to replace a drive chip manufactured by using an external connecting IC. This is referred to as a gate on array (GOA) drive technology and can be directly used around a panel, reducing manufacturing procedures, reducing product costs, and thinning the panel.

However, an existing gate shutdown signal VSS is generated by cooperating with a related logic module and a related circuit and by using two timing signals using ½ period as a time delay. If such lines are not well designed, the gate shutdown signal VSS cannot be kept at a fixed value for a long time, causing operation confusion of the lines. If a shift register is connected to an active switch of a frequency signal, when the frequency signal is switched to a low electric potential, the active switch is easily turned on because the low electric potential of the frequency signal is less than the gate shutdown signal VSS, leading to excessive power consumption by an increase in a charging time of a panel. Severely, abnormal operation of the panel may be caused and the panel may be damaged.

SUMMARY

An objective of this application is to provide a shutdown signal generation circuit and a display apparatus, so as to provide a stable gate shutdown signal and avoid abnormal operation of lines.

A shutdown signal generation circuit provided in this application is disposed on an array substrate, and includes: a first switch, where a first end of the first switch is electrically coupled to a first frequency, a control end of the first switch is electrically coupled to a first node, and a second end of the first switch is electrically coupled to a second node; and a second switch, where a first end of the second switch is electrically coupled to a second frequency, a control end of the second switch is electrically coupled to the first node, and a second end of the second switch is electrically coupled to the second node, where the first node is electrically coupled to a control signal, the second node electrically outputs a gate shutdown signal, potential-controlled polarities of the control ends of the first switch and the second switch are opposite to each other, the first switch is turned on and the second switch is turned off when the control signal is at a first electric potential, and the second switch is turned on and the first switch is turned off when the control signal is at a second electric potential.

In an embodiment of this application, high electric potential values of the first frequency and the second frequency are the same or similar, and low electric potential values of the first frequency and the second frequency are the same or similar.

In an embodiment of this application, in a same time period, electric potentials of the first frequency and the second frequency are different.

In an embodiment of this application, the first switch and the second switch are transistors.

In an embodiment of this application, a transistor polarity of the first switch is opposite to a transistor polarity of the second switch.

In an embodiment of this application, the first end of the first switch is a source, the control end of the first switch is a gate, and the second end of the first switch is a drain; and the first end of the second switch is a source, the control end of the second switch is a gate, and the second end of the second switch is a drain.

In an embodiment of this application, when the first switch is turned on, the first frequency is output at a low electric potential; and when the second switch is turned on, the second frequency is output at a low electric potential.

In an embodiment of this application, the shutdown signal generation circuit further includes a logic unit, disposed in a wiring region of the array substrate and being electrically coupled to the first node, where the logic unit provides the control signal to adjust electric potentials at the control ends of the first switch and the second switch.

In an embodiment of this application, the first electric potential is higher than the second electric potential, the first electric potential is a high voltage 3.3 V, and the second electric potential is a low voltage 0 V.

In an embodiment of this application, the shutdown signal generation circuit is disposed in a wiring region on a side of a gate drive circuit.

Another objective of this application is to provide a display apparatus. The display apparatus includes: a display panel, including an array substrate and a counter substrate disposed opposite to the array substrate, where the array substrate includes a display region and a peripheral wiring region of the display region, and a plurality of active switches, a plurality of pixel units, a plurality of gate lines, and a plurality of source lines are disposed in the display region; a gate drive circuit, disposed in the wiring region, where the gate drive circuit is disposed at two sides of the array substrate and is electrically coupled to the plurality of gate lines; and any shutdown signal generation circuit described above, where the shutdown signal generation circuit is disposed in at least a part of the wiring region at the two sides of the array substrate, and a signal output end of the shutdown signal generation circuit is electrically coupled to the gate drive circuit.

Still another objective of this application is to provide a shutdown signal generation circuit, disposed on an array substrate, and includes: a first switch, where a first end of the first switch is electrically coupled to a first frequency, a control end of the first switch is electrically coupled to a first node, and a second end of the first switch is electrically coupled to a second node; a second switch, where a first end of the second switch is electrically coupled to a second frequency, a control end of the second switch is electrically coupled to the first node, and a second end of the second switch is electrically coupled to the second node. The first node is electrically coupled to a control signal, and the second node electrically outputs a gate shutdown signal. High electric potential values of the first frequency and the second frequency are the same or similar, and low electric potential values of the first frequency and the second frequency are the same or similar. A transistor polarity of the first switch is opposite to a transistor polarity of the second switch. In a first period, the control signal is at a first electric potential, the first switch is turned on, the second switch is turned off, and the gate shutdown signal is the first frequency. In a second period, the control signal is at a second electric potential, the second switch is turned on, the first switch is turned off, and the gate shutdown signal is the second frequency.

This application can maintain a process requirement, reduce product costs, provide a stable gate shutdown signal and avoid abnormal operation of lines without significantly changing the existing manufacturing process.

DETAILED DESCRIPTION

Figure 1A:
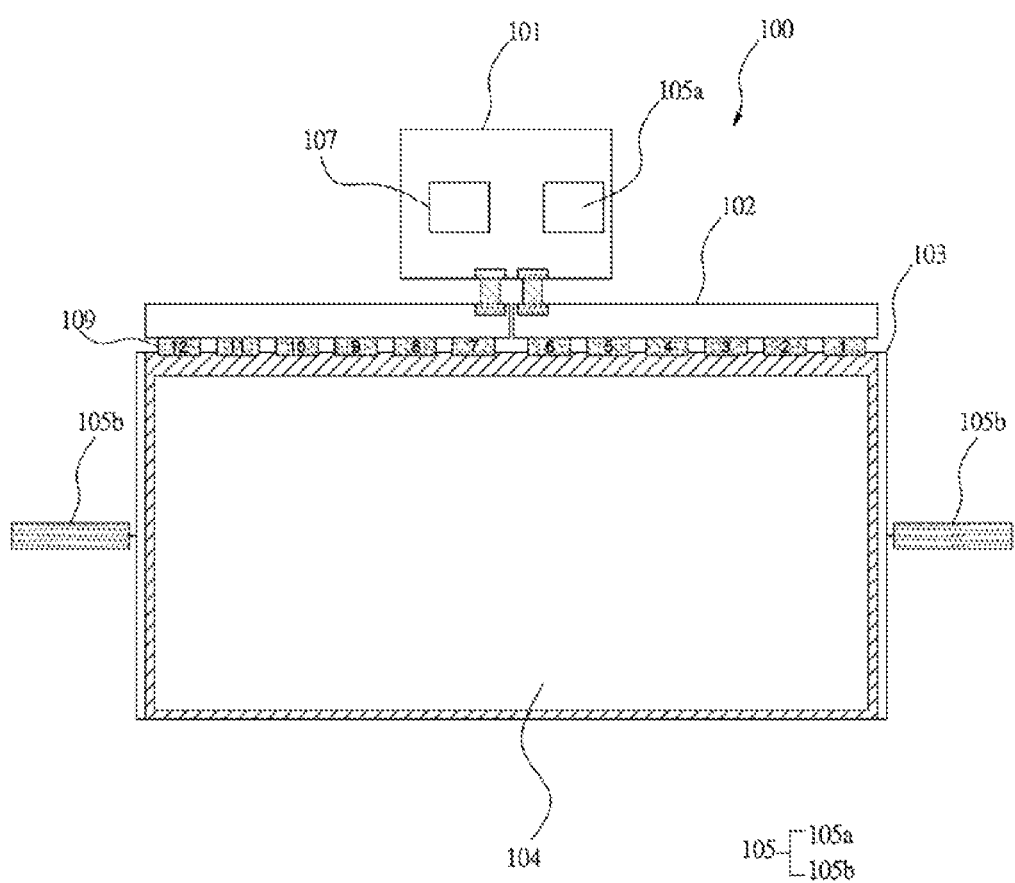
FIG. 1a is a schematic structural diagram showing a configuration of an exemplary display apparatus.

The following embodiments are described with reference to the accompanying drawings, used to exemplify specific embodiments for implementation of this application. Direction terms mentioned in this application, such as "on", "below", "front", "back", "left", "right", "in", "out", and "side" merely refer to directions in the accompanying drawings. Therefore, the direction terms used are for the purpose of describing and understanding this application, and are not intended to limit this application.

The accompanying drawings and the description are considered to be essentially exemplary, rather than limitative. In the figures, modules with similar structures are represented by using a same reference numeral. In addition, for understanding and ease of description, the size and the thickness of each component shown in the accompanying drawings are arbitrarily shown, but this application is not limited thereto.

In the accompanying drawings, for clarity, the thicknesses of a layer, a film, a panel, a region, and the like are exaggerated, and representation of a circuit configuration in a related region is also exaggerated. It should be understood when a component such as a layer, a film, a region, a circuit, or a substrate is described to be "on" another component, the component may be directly on the another component, or there may be an intermediate component.

In addition, in this specification, unless otherwise explicitly described, the word "include" is understood as including the component, but not excluding any other component. In addition, in this specification, "on" means a component is located above or below a target component, but does not mean the component needs to be located on the top based on the direction of gravity.

To further describe technical means used in this application to achieve a preset inventive objective and technical effects of this application, specific implementations, structures, features, and effects of a shutdown signal generation circuit and a display apparatus provided according to this application are described in detail below with reference to the accompanying drawings and preferred embodiments.

FIG. 1a is a schematic structural diagram showing a configuration of an exemplary display apparatus. Referring to FIG. 1a, a GOA drive display apparatus 100 includes a control plate 101, a printed circuit board 102, a color filter substrate 103, and an active array substrate 104. A gate drive circuit (Gate Driver) 105 is divided into two parts: a level shifter 105a and shift registers 105b. The level shifter 105a is disposed on the control plate 101. The shift registers 105b are disposed on the active array substrate 104. In some embodiments, the shift registers 105b are configured at two sides of the active array substrate 104. According to a line design, the shift registers 105b may be disposed in a wiring region of the active array substrate 104. Because the shift register 105b has a small area, the GOA drive panel may usually support an ultra-narrow frame.

In some embodiments, a system main board provides a color (for example, R/G/B) compression signal, a control signal, and power transmission to the control plate 101. A timing controller (TCON) 107 on the control plate 101 and a power source processed by a drive circuit after the signals are processed are transmitted together to a source circuit and a gate circuit of the printed circuit board 102 by using a flexible flat cable (FFC) or the like. Necessary data and the power source are transmitted to a display region by using a source chip on film 109 and the GOA drive circuit configured in the wiring region of the active array substrate 104. In this way, the display apparatus obtains a power source and a signal required for presenting an image.

Figure 1B:
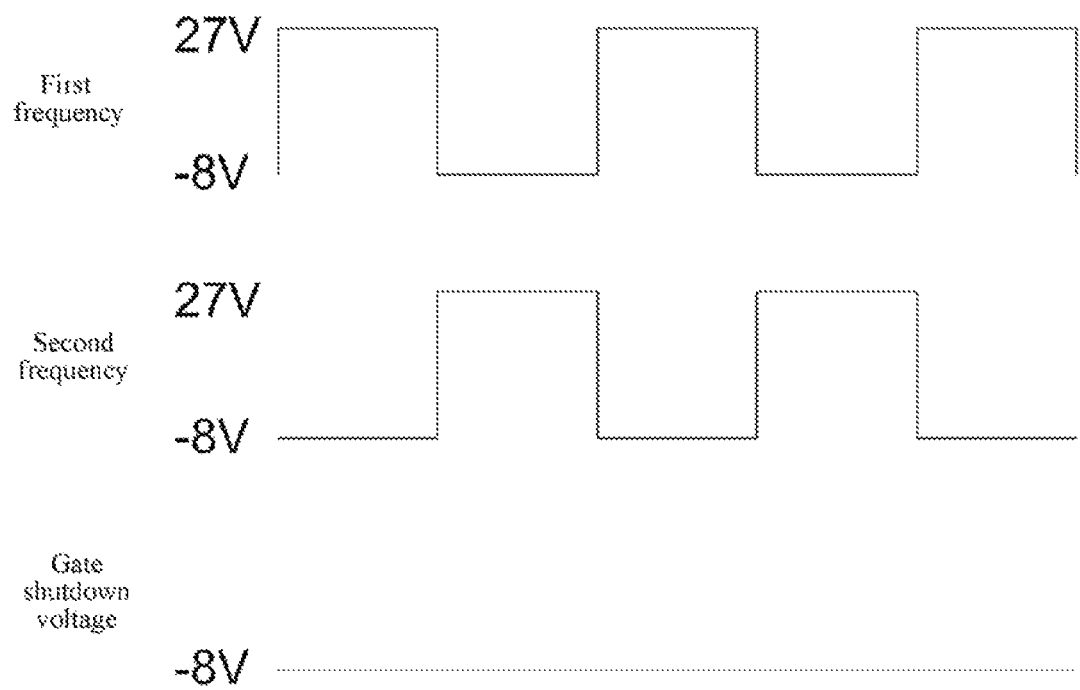
FIG. 1b is a signal timing diagram of a gate shutdown signal of an exemplary liquid crystal display apparatus.

FIG. 1b is a signal timing diagram of a gate shutdown signal of an exemplary liquid crystal display apparatus. In some embodiments, the gate shutdown signal VSS is generated by cooperating with a related logic module and a related circuit and by using two timing signals using ½ period as a time delay. For example, in different periods, low electric potentials of the two timing signals are alternately extracted. In some embodiments, the logic module includes, but is not limited to, a timing control unit.

However, if such lines are not well designed, the gate shutdown signal VSS cannot be kept at a fixed value for a long time, causing operation confusion of the lines. For example, an active switch on the gate drive circuit 105 connecting to a frequency signal is turned on, leading to excessive power consumption by an increase in a charging time of a panel. Severely, abnormal operation of the panel may be caused and the panel may be damaged.

Figure 2A:
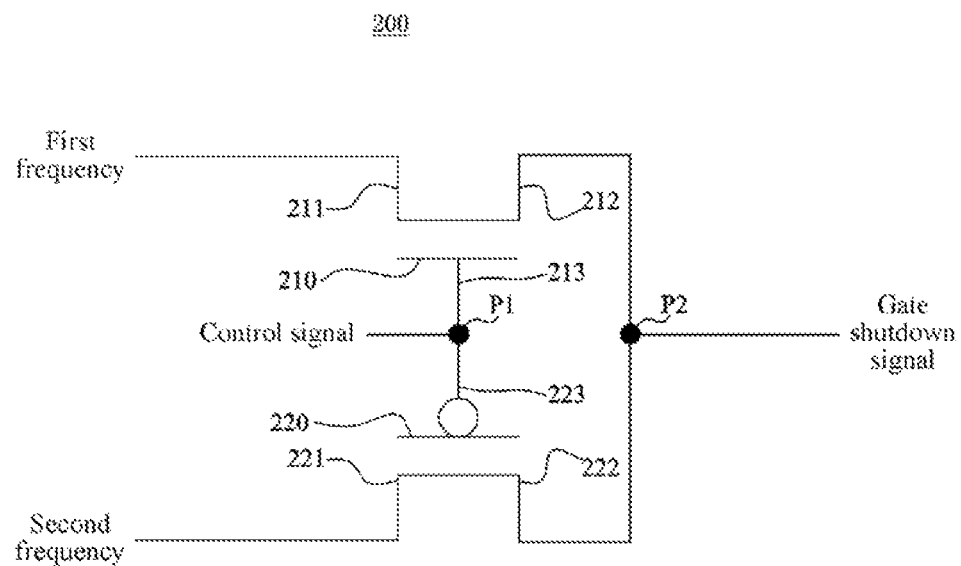
FIG. 2a is a schematic architectural diagram of a shutdown signal generation circuit of a display panel according to an embodiment of this application.

FIG. 2a is a schematic architectural diagram of a shutdown signal generation circuit of a display panel according to an embodiment of this application. In an embodiment of this application, the shutdown signal generation circuit 200 includes a first switch 210, where a first end 211 of the first switch 210 is electrically coupled to a first frequency (Clock voltage pulse, CKV), a control end 213 of the first switch 210 is electrically coupled to a first node P1, and a second end 212 of the first switch 210 is electrically coupled to a second node P2; and a second switch 220, where a first end 221 of the second switch 220 is electrically coupled to a second frequency (Clock voltage pulse extend, CKVX), a control end 223 of the second switch 220 is electrically coupled to the first node P1, and a second end 222 of the second switch 220 is electrically coupled to the second node P2. The first node P1 is electrically coupled to a control signal, and the second node P2 electrically outputs a gate shutdown signal VSS.

In some embodiments, the first switch 210 and the second switch 220 are transistors.

In some embodiments, the first end 211 of the first switch 210 is a source, the control end 213 of the first switch 210 is a gate, and the second end 212 of the first switch 210 is a drain; and the first end 221 of the second switch 220 is a source, the control end 223 of the second switch 220 is a gate, and the second end 222 of the second switch 220 is a drain.

Figure 2B:
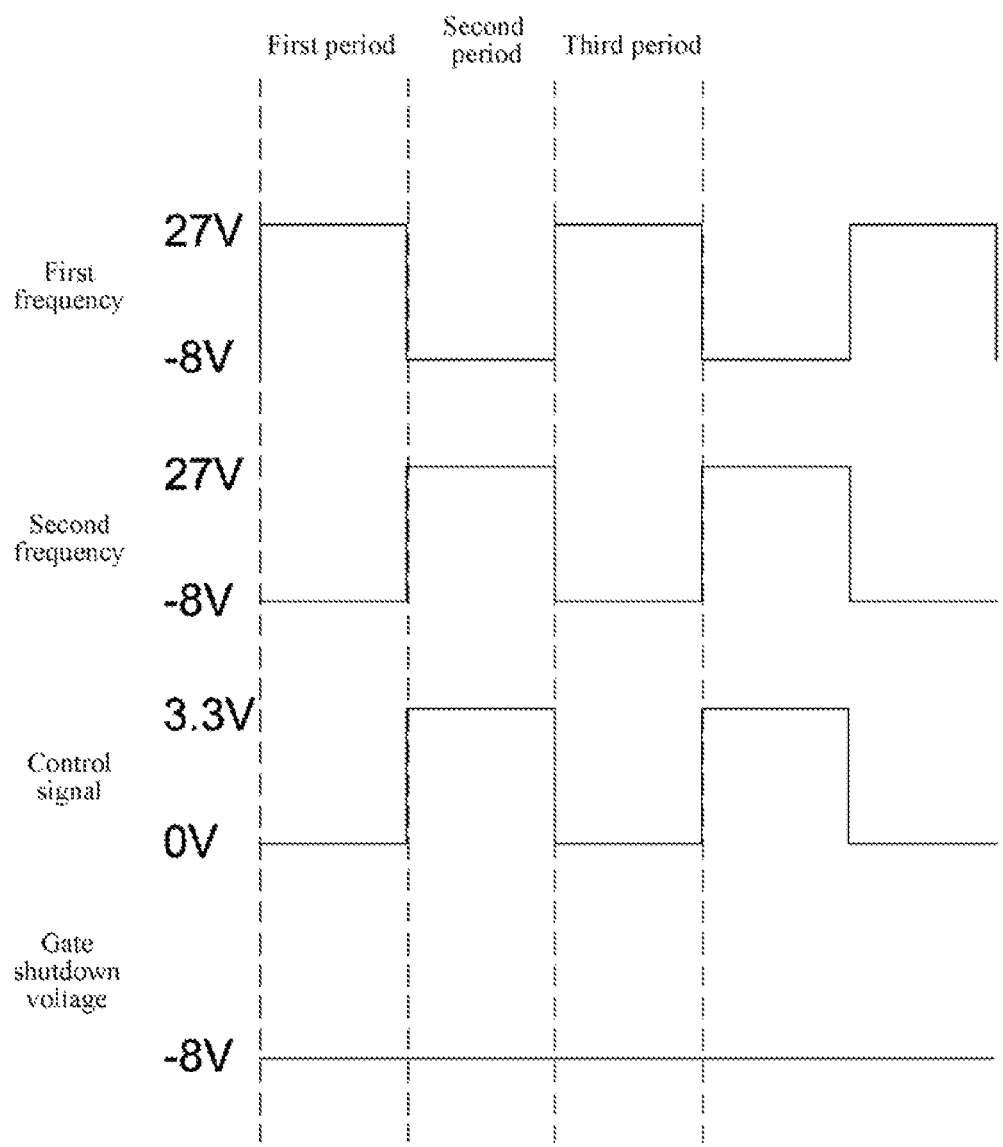
FIG. 2b is a signal timing diagram of a gate shutdown signal of a display panel according to an embodiment of this application.

FIG. 2b is a signal timing diagram of a gate shutdown signal of a display panel according to an embodiment of this application. Understanding is facilitated based on FIG. 2a. In some embodiments, a printed circuit board 102 connected to the display panel is configured to provide the control signal. The control signal has a first electric potential value and a second electric potential value, and the first electric potential value is greater than the second electric potential value. In some embodiments, the first electric potential value is a high voltage 3.3 V, but is not limited thereto; and the second electric potential value is a low voltage 0 V, but is not limited thereto.

In some embodiments, the shutdown signal generation circuit 200 is connected to a timing controller 107. The timing controller 107 provides a first frequency CKV and a second frequency CKVX using ½ period as a time delay. The two signals are respectively received by the first end 211 of the first switch 210 and the first end 221 of the second switch 220.

In some embodiments, high electric potential values of the first frequency CKV and the second frequency CKVX are the same or similar, and low electric potential values of the first frequency CKV and the second frequency CKVX are the same or similar. As shown in FIG. 2b, the high electric potential value is a high voltage 27 V, but is not limited thereto; and the low electric potential value is a low voltage −8 V, but is not limited thereto.

In some embodiments, in a same time period, electric potentials of the first frequency CKV and the second frequency CKVX are different. As shown in FIG. 2b, in a first time period, the first frequency CKV is at a high electric potential, and the second frequency CKVX is at a low frequency; and in a second time period, the first frequency CKV is at a low electric potential, and the second frequency CKVX is at a high frequency.

In some embodiments, a transistor polarity of the first switch 210 is opposite to a transistor polarity of the second switch 220, the first switch 210 is turned on and the second switch 220 is turned off when the control signal is at a first electric potential, and the second switch 220 is turned on and the first switch 210 is turned off when the control signal is at a second electric potential.

Figure 2C:
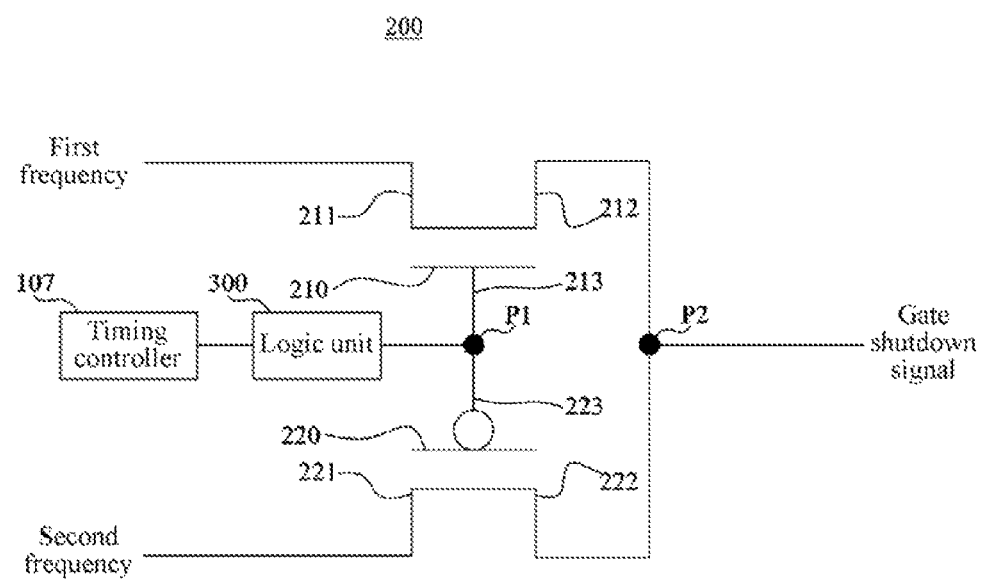
FIG. 2c is a signal timing diagram of a gate shutdown signal of a display panel according to an embodiment of this application.

FIG. 2c is a signal timing diagram of a gate shutdown signal of a display panel according to an embodiment of this application. Understanding is facilitated based on FIG. 2a and FIG. 2b. For technical components of an existing display apparatus, understanding is facilitated based on FIG. 1a and FIG. 1b. In some embodiments, the control signal is provided by a logic unit 300. The logic unit 300 may be disposed in the wiring region, or may be disposed in combination with the control plate 101 and the printed circuit board 102.

In some embodiments, the logic unit 300 is electrically coupled to the timing controller 107, and is controlled by the timing controller 107, so as to adjust an electric potential change of the control signal.

Figure 3A:
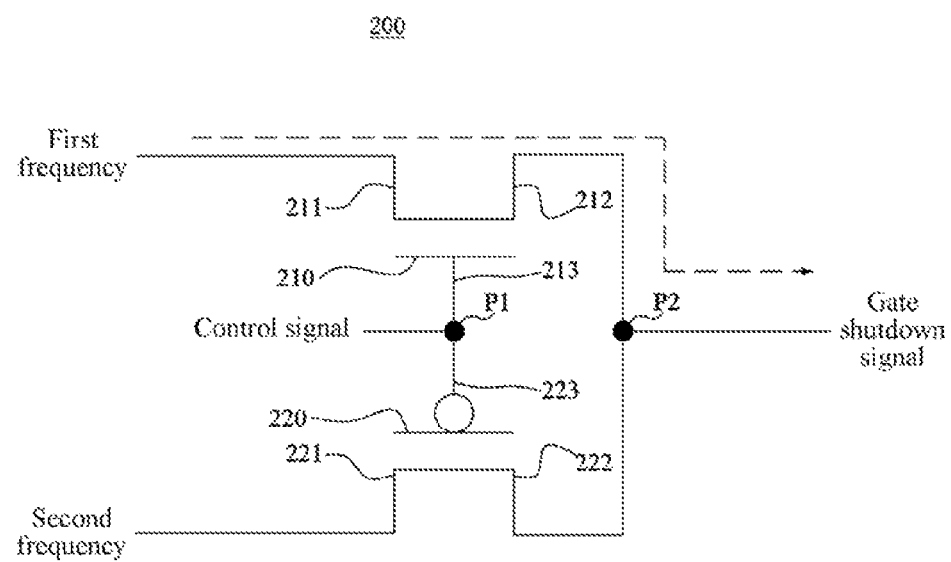
FIG. 3a is a schematic operation diagram of a shutdown signal generation circuit according to an embodiment of this application.

FIG. 3a is a schematic operation diagram of a shutdown signal generation circuit according to an embodiment of this application. Understanding is facilitated based on the schematic waveform diagram of FIG. 2b. In a first period T1, the control signal is at the first electric potential (a low electric potential), the first switch 210 is turned on, and the second switch 220 is turned off. In this case, the gate shutdown signal VSS is the second frequency CKVX.

Figure 3B:
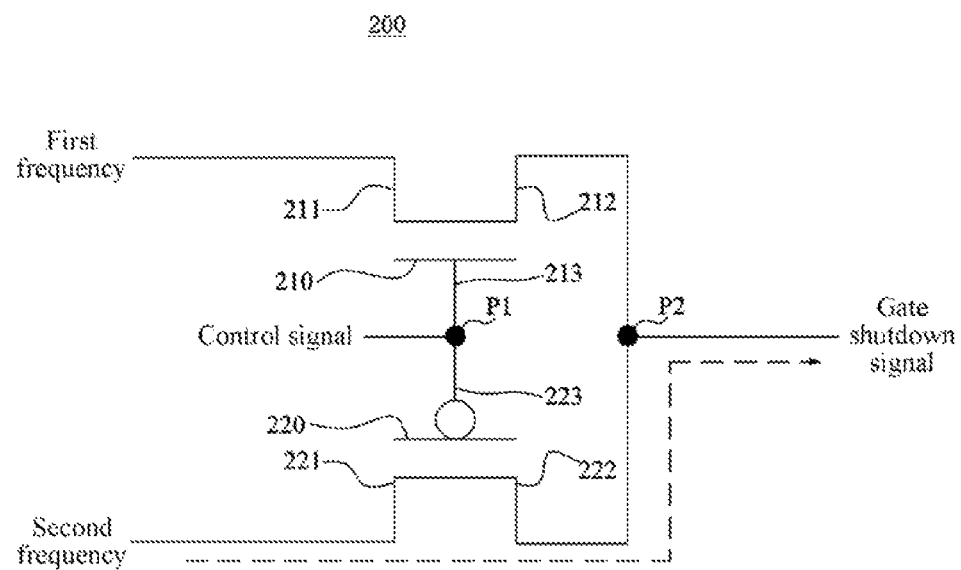
FIG. 3b is a schematic operation diagram of a shutdown signal generation circuit according to an embodiment of this application.

FIG. 3b is a schematic operation diagram of a shutdown signal generation circuit according to an embodiment of this application. Understanding is facilitated based on the schematic waveform diagram of FIG. 2b. In a second period T2, the control signal is at the second electric potential (high electric potential), the second switch 220 is turned on, and the first switch 210 is turned off. In this case, the gate shutdown signal VSS is the first frequency CKV.

In some embodiments, a period of the control signal is the same as those of the first frequency CKV and the second frequency CKVX, a time point when the control signal is at the first electric potential is the same as a time point when the CKV is at a low voltage, and a time point when the control signal is at the second electric potential is the same as a time point when the CKVX is at a low voltage. The gate shutdown voltage VSS is provided by means of interaction between the first frequency CKV and the second frequency CKVX at the low electric potential, and can be kept at a particular constant value or approximate value. In this example, the gate shutdown signal VSS is equal to the low electric potential value of the first frequency CKV and the second frequency CKVX, that is, a low voltage −8 V, but is not limited thereto.

In some embodiments, the shutdown signal generation circuit 200 is disposed in a wiring region on a side of a gate drive circuit.

In some embodiments, the shutdown signal generation circuit 200 uses a GOA drive line configuration manner.

Figure 4:
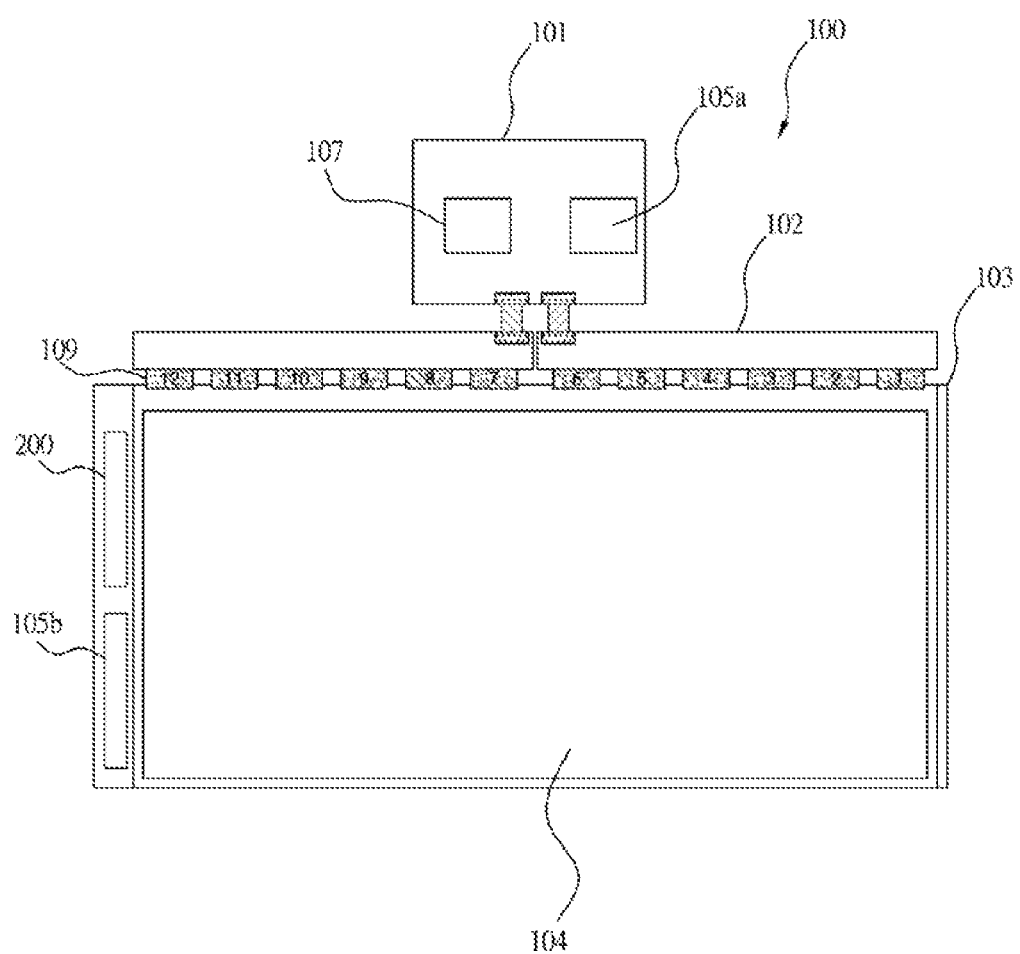
FIG. 4 is a schematic architectural diagram of an array substrate according to an embodiment of this application.

FIG. 4 is a schematic architectural diagram of an array substrate according to an embodiment of this application. In some embodiments, the array substrate includes a display region and a wiring region. In some embodiments, a shutdown signal generation circuit is disposed at a fanout position of the array substrate in combination with an existing GOA drive circuit configuration manner. The shutdown signal generation circuit is the shutdown signal generation circuit 200 in any one of the foregoing embodiments. The shutdown signal generation circuit 200 may be designed in combination with a gate drive circuit 105. A first frequency CKV and a second frequency CKVX provided by a timing controller 107 are simultaneously provided to the shutdown signal generation circuit 200 and the gate drive circuit 105. The gate drive circuit 105 uses a gate shutdown signal VSS generated by the shutdown signal generation circuit 200.

In an embodiment of this application, a display apparatus 100 includes a display panel, where the display panel includes an array substrate 104 and a counter substrate disposed opposite to the array substrate, the counter substrate includes but is not limited to a color filter substrate or the counter substrate may be a mating substrate required for a design when a color filter is disposed on the array substrate, the array substrate 104 includes a display region and a peripheral wiring region of the display region, a gate drive circuit 105 is disposed in the wiring region, a plurality of active switches, a plurality of pixel units, a plurality of gate lines, and a plurality of source lines are disposed in the display region, the plurality of pixel units is electrically coupled to intersections of the plurality of gate lines and the plurality of source lines by using the corresponding plurality of active switches, the gate drive circuit 105 is disposed at two sides of the array substrate 104 and is electrically coupled to the plurality of gate lines; and the shutdown signal generation circuit 200 according to any one of the foregoing embodiments. The shutdown signal generation circuit 200 is disposed in at least a part of the wiring region at the two sides of the array substrate 104, and a signal output end (a second node P2, an output end of a gate shutdown signal VSS) of the shutdown signal generation circuit 200 is electrically coupled to the gate drive circuit 105.

In some embodiments, the display panel in this application may be, for example, a liquid crystal display panel, but is not limited thereto. The display panel may also be an OLED display panel, a W-OLED display panel, a QLED display panel, a plasma display panel, a curved display panel, or a display panel of another type.

This application can maintain a process requirement, reduce product costs, provide a stable gate shutdown signal and avoid abnormal operation of lines without significantly changing the existing manufacturing process.

Phrases such as "in some embodiments" and "in various embodiments" are repeatedly used. Usually, the terms do not refer to a same embodiment; but they may also refer to a same embodiment. Terms such as "comprise", "have", and "include" are synonyms, unless otherwise described in context.

Descriptions above are merely specific embodiments of this application, and are not intended to limit this application. Although this application has been disclosed above through the specific embodiments, the embodiments are not intended to limit this application. A person skilled in the art can make some equivalent variations, alterations or modifications to the above-disclosed technical content without departing from the scope of the technical solutions of this application to obtain equivalent embodiments. Any simple alteration, equivalent change or modification made to the above embodiments according to the technical essence of this application without departing from the content of the technical solutions of this application shall fall within the scope of the technical solutions of this application.

What is claimed is:

1. A shutdown signal generation circuit, disposed on an array substrate, wherein the shutdown signal generation circuit comprises:
    a first switch, wherein a first end of the first switch is electrically coupled to a first frequency, a control end of the first switch is electrically coupled to a first node, and a second end of the first switch is electrically coupled to a second node; and
    a second switch, wherein a first end of the second switch is electrically coupled to a second frequency, a control end of the second switch is electrically coupled to the first node, and a second end of the second switch is electrically coupled to the second node, wherein the first node is electrically coupled to a control signal, the second node electrically outputs a gate shutdown signal, potential-controlled polarities of the control ends of the first switch and the second switch are opposite to each other, the first switch is turned on and the second switch is turned off when the control signal is at a first electric potential, and the second switch is turned on and the first switch is turned off when the control signal is at a second electric potential.

2. The shutdown signal generation circuit according to claim 1, wherein high electric potential values of the first frequency and the second frequency are the same or similar, and low electric potential values of the first frequency and the second frequency are the same or similar.

3. The shutdown signal generation circuit according to claim 1, wherein in a same time period, electric potentials of the first frequency and the second frequency are different.

4. The shutdown signal generation circuit according to claim 1, wherein the first switch and the second switch are transistors.

5. The shutdown signal generation circuit according to claim 4, wherein the first end of the first switch is a source, the control end of the first switch is a gate, and the second end of the first switch is a drain; and the first end of the second switch is a source, the control end of the second switch is a gate, and the second end of the second switch is a drain.

6. The shutdown signal generation circuit according to claim 4, wherein a transistor polarity of the first switch is opposite to a transistor polarity of the second switch.

7. The shutdown signal generation circuit according to claim 1, wherein when the first switch is turned on, the first frequency is output at a low electric potential; and when the second switch is turned on, the second frequency is output at a low electric potential.

8. The shutdown signal generation circuit according to claim 1, further comprising a logic unit, disposed in a wiring region of the array substrate and electrically coupled to the first node, wherein the logic unit provides the control signal to adjust electric potentials at the control ends of the first switch and the second switch.

9. The shutdown signal generation circuit according to claim 1, wherein the first electric potential is higher than the second electric potential, the first electric potential is a high voltage 3.3 V, and the second electric potential is a low voltage 0 V.

10. A display apparatus, comprising:
    a display panel, comprising an array substrate and a counter substrate disposed opposite to the array substrate, wherein the array substrate comprises a display region and a peripheral wiring region of the display region, and a plurality of active switches, a plurality of pixel units, a plurality of gate lines, and a plurality of source lines are disposed in the display region;
    a gate drive circuit, disposed in the wiring region, wherein the gate drive circuit is disposed at two sides of the array substrate and is electrically coupled to the plurality of gate lines; and
    a shutdown signal generation circuit, comprising:
    a first switch, wherein a first end of the first switch is electrically coupled to a first frequency, a control end of the first switch is electrically coupled to a first node, and a second end of the first switch is electrically coupled to a second node; and
    a second switch, wherein a first end of the second switch is electrically coupled to a second frequency, a control end of the second switch is electrically coupled to the first node, and a second end of the second switch is electrically coupled to the second node, wherein the first node is electrically coupled to a control signal, the second node electrically outputs a gate shutdown signal, potential-controlled polarities of the control ends of the first switch and the second switch are opposite to each other, the first switch is turned on and the second switch is turned off when the control signal is at a first electric potential, and the second switch is turned on and the first switch is turned off when the control signal is at a second electric potential; and the shutdown signal generation circuit is disposed in at least a part of the wiring region at the two sides of the array substrate, and a signal output end of the shutdown signal generation circuit is electrically coupled to the gate drive circuit.

11. The display apparatus according to claim 10, wherein high electric potential values of the first frequency and the second frequency are the same or similar.

12. The display apparatus according to claim 10, wherein low electric potential values of the first frequency and the second frequency are the same or similar.

13. The display apparatus according to claim 10, wherein in a same time period, electric potentials of the first frequency and the second frequency are different.

14. The display apparatus according to claim 10, wherein the first switch and the second switch are transistors.

15. The display apparatus according to claim 14, wherein the first end of the first switch is a source, the control end of the first switch is a gate, and the second end of the first switch is a drain; and the first end of the second switch is a source, the control end of the second switch is a gate, and the second end of the second switch is a drain.

16. The display apparatus according to claim 14, wherein a transistor polarity of the first switch is opposite to a transistor polarity of the second switch.

17. The display apparatus according to claim 10, wherein when the first switch is turned on, the first frequency is output at a low electric potential; and when the second switch is turned on, the second frequency is output at a low electric potential.

18. The display apparatus according to claim 10, wherein the shutdown signal generation circuit further comprises a logic unit, disposed in a wiring region of the array substrate and being electrically coupled to the first node, wherein the logic unit provides the control signal to adjust electric potentials at the control ends of the first switch and the second switch.

19. The display apparatus according to claim 10, wherein the first electric potential is higher than the second electric potential, the first electric potential is a high voltage 3.3 V, and the second electric potential is a low voltage 0 V.

20. A shutdown signal generation circuit, disposed on an array substrate, wherein the shutdown signal generation circuit comprises:

a first switch, wherein a first end of the first switch is electrically coupled to a first frequency, a control end of the first switch is electrically coupled to a first node, and a second end of the first switch is electrically coupled to a second node; and a second switch, wherein a first end of the second switch is electrically coupled to a second frequency, a control end of the second switch is electrically coupled to the first node, and a second end of the second switch is electrically coupled to the second node, wherein the first node is electrically coupled to a control signal, and the second node electrically outputs a gate shutdown signal;

high electric potential values of the first frequency and the second frequency are the same or similar, and low electric potential values of the first frequency and the second frequency are the same or similar;

a transistor polarity of the first switch is opposite to a transistor polarity of the second switch;

in a first period, the control signal is at a first electric potential, the first switch is turned on, the second switch is turned off, and the gate shutdown signal is the first frequency; and in a second period, the control signal is at a second electric potential, the second switch is turned on, the first switch is turned off, and the gate shutdown signal is the second frequency.

* * * * *